US009942658B2

(12) United States Patent
Zurek et al.

(10) Patent No.: US 9,942,658 B2
(45) Date of Patent: Apr. 10, 2018

(54) METHOD AND APPARATUS FOR INCREASING AUDIO OUTPUT OF A DEVICE

(71) Applicant: Motorola Mobility LLC, Chicago, IL (US)

(72) Inventors: Robert Zurek, Antioch, IL (US); Kevin J Bastyr, Milwaukee, WI (US); Joel Clark, Woodridge, IL (US); Giles T Davis, Mundelein, IL (US); Adrian M Schuster, West Olive, MI (US)

(73) Assignee: Motorola Mobility LLC, Chicago, IL (US)

( * ) Notice: Subject to any disclaimer, the term of this patent is extended or adjusted under 35 U.S.C. 154(b) by 128 days.

(21) Appl. No.: 14/938,423

(22) Filed: Nov. 11, 2015

(65) Prior Publication Data

US 2017/0134857 A1 May 11, 2017

(51) Int. Cl.

| | |
|---|---|
| ***H03G 5/00*** | (2006.01) |
| ***H04R 3/14*** | (2006.01) |
| ***H04R 3/00*** | (2006.01) |
| ***H04R 29/00*** | (2006.01) |
| *H04R 1/28* | (2006.01) |

(52) U.S. Cl.

CPC ............... *H04R 3/14* (2013.01); *H04R 3/007* (2013.01); *H04R 29/001* (2013.01); *H04R 1/2819* (2013.01); *H04R 2430/01* (2013.01); *H04R 2499/11* (2013.01)

(58) Field of Classification Search

CPC ........ H04R 3/14; H04R 3/007; H04R 29/001; H04R 2430/01; H04R 2499/11

USPC .................................................... 381/99, 104

See application file for complete search history.

(56) References Cited

U.S. PATENT DOCUMENTS

| | | | | |
|---|---|---|---|---|
| 6,636,750 | B1 | 10/2003 | Zurek et al. | |
| 7,925,307 | B2 * | 4/2011 | Horowitz ............ | H04M 1/6041 455/556.2 |
| 8,712,086 | B2 | 4/2014 | Zurek et al. | |
| 9,614,489 | B2 * | 4/2017 | Cheng .................... | H03G 9/025 |
| 2006/0210105 | A1 * | 9/2006 | Liao .................... | G06F 3/03543 381/334 |

(Continued)

*Primary Examiner* — William A Jerez Lora

(74) *Attorney, Agent, or Firm* — Matthew C. Loppnow; The Watson I.P. Group PLC

(57) ABSTRACT

A method and apparatus increase audio output of a device. A mode of audio output operation of a device can be determined. Audio output can operate in a determined first mode of audio output operation that powers at least one first speaker at a first bandwidth and at a first output level below a first output level threshold. The audio output can operate in a determined second mode of audio output operation. The second mode of audio output operation can power the at least one first speaker at a high pass filtered second bandwidth that filters out low frequencies of the first bandwidth. The second mode of audio output operation can power the at least one first speaker at a second output level below a second output level threshold. The second output level threshold can be higher than the first output level threshold. The second output level can exceed the first output level threshold at least once. The second mode of audio output operation can power at least one second speaker at a low pass filtered second speaker bandwidth that includes at least the low frequencies of the first bandwidth.

20 Claims, 6 Drawing Sheets

(56) References Cited

U.S. PATENT DOCUMENTS

| | | | | |
|---|---|---|---|---|
| 2006/0219474 | A1* | 10/2006 | Goh | H04R 1/2842 181/156 |
| 2008/0101589 | A1* | 5/2008 | Horowitz | H04M 1/035 379/388.03 |
| 2010/0246838 | A1* | 9/2010 | Trautmann | H04R 3/04 381/59 |
| 2011/0170710 | A1* | 7/2011 | Son | H04R 5/04 381/98 |
| 2012/0195447 | A1* | 8/2012 | Hiruma | H04S 7/303 381/306 |
| 2015/0010168 | A1* | 1/2015 | Cheng | H04R 3/002 381/107 |

* cited by examiner

METHOD AND APPARATUS FOR INCREASING AUDIO OUTPUT OF A DEVICE

BACKGROUND

1. Field

The present disclosure is directed to a method and apparatus for increasing audio output of a device. More particularly, the present disclosure is directed to increasing audio output above a threshold for at least one speaker of at least two speakers coupled to a device.

2. Introduction

Presently, portable electronic devices, such as smartphones and tablet computers, include many features for user entertainment. These features include the ability to play streaming and stored audio, such as from music, videos, movies, games, and other data sources that produce audio signals. While a user can listen to the audio through headphones, the user may want to play audio straight from the device speakers, such as when they are at home or when they want to share multimedia with others. Unfortunately, portable electronic devices are small for portability purposes and the small size does not allow for adequate speaker capabilities to produce full audio at high sound levels.

Thus, there is a need for a method and apparatus for increasing audio output of a device.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore to be considered to be limiting of its scope.

DETAILED DESCRIPTION

Figure 1:
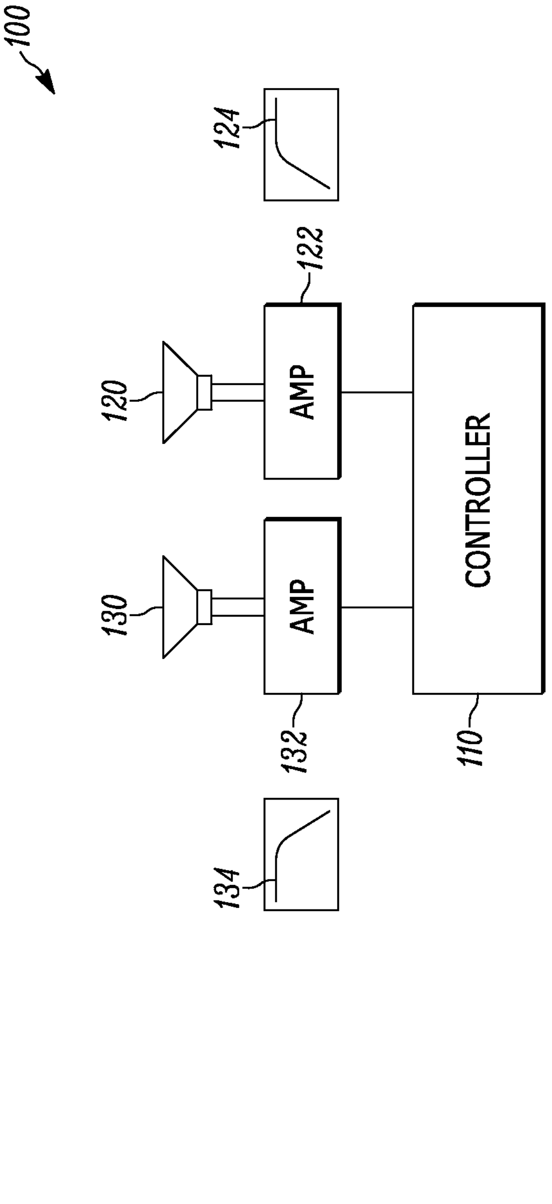
FIG. 1 is an example diagram of an apparatus according to a possible embodiment.

Embodiments provide a method and apparatus for increasing audio output of a device. A mode of audio output operation of a device can be determined. Audio output can operate in a determined first mode of audio output operation that powers at least one first speaker at a first bandwidth and at a first output level below a first output level threshold. The audio output can operate in a determined second mode of audio output operation. The second mode of audio output operation can power the at least one first speaker at a high pass filtered second bandwidth that filters out low frequencies of the first bandwidth. The second mode of audio output operation can power the at least one first speaker at a second output level below a second output level threshold. The second output level threshold can be higher than the first output level threshold. The second output level can exceed the first output level threshold at least once. The second mode of audio output operation can power at least one second speaker at a low pass filtered second speaker bandwidth that includes at least the low frequencies of the first bandwidth.

Docks with speakers are often used with portable devices to increase frequency response and audio levels of audio output from the device. In order to produce a true dock quality audio system in a portable device, a large amount of spatial volume and larger transducers are required. If this were to be integrated into, for example, a normal smartphone, the size of the phone would more than double. Smart audio amplifier technology that can adapt gain in real time by considering excursion and thermal limitations of a speaker can push the capabilities of portable audio systems, but the resulting system is sometimes a compromise between bandwidth and level. To extend the bandwidth, more excursion is required in the low frequencies. For example, excursion can be defined as how far the cone of a speaker linearly travels from its resting position. To increase the sound pressure level in the high frequencies, more thermal power must be dissipated in the speaker.

There is an interaction between the excursion and thermal power ratings of a speaker that can force a designer to either produce loud high frequency output, extended low frequency output, or a compromised response in between. High frequency content can limit the amount of excursion that the speaker can handle over short periods of time, high frequency content also contributes significantly to the thermal power, which can limit the speaker before it reaches is excursion limit, and low frequency content can limit the output due to excursion before the thermal power limit of the speaker is reached. Therefore, a single loudspeaker that covers the whole range does not perform as well as that same speaker producing either just high frequencies or just low frequencies.

An additional accessory can be added to a portable device to enhance the audio. However, adding a multi-way system, such as a 2.1 system, in the device duplicates some speaker functionality that is already present in the device. This can lead to an accessory that is overly large and significantly larger than the size of a device that was designed to produce the entire frequency range by the device itself. Also, simply adding a low frequency speaker accessory to accompany the integrated speakers may improve the low frequency bandwidth, but the overall level will still be limited by the sensitivity of the integrated speakers. Embodiments can provide a way to add an accessory to the device that will provide a wider frequency range, higher overall audio levels, and remain in a reasonable package size while minimizing cost. Embodiments also provide for providing a wider frequency range and higher overall audio levels in a device itself.

FIG. 1 is an example diagram of an apparatus 100 according to a possible embodiment. The apparatus 100 can be a wireless terminal, a portable wireless communication device, a smartphone, a cellular telephone, a flip phone, a personal digital assistant, a personal computer, a selective call receiver, a tablet computer, a public address system, a home stereo system, a Bluetooth audio system, or any other device that is capable of outputting audio. The apparatus 100 can include a controller 110, a first amplifier 122 coupled to the controller 110, a first speaker 120 coupled to the first amplifier 122, a second amplifier 132 coupled to the controller 110, and a second speaker 130 coupled to the second amplifier 132. At least the first amplifier 122 can be a smart audio amplifier that controls the amplitude and bandwidth of audio sent to the speaker 120 as a function of an apparatus mode. The controller 110 can control operations of the apparatus 100. For example, the controller 110 can determine a mode of audio output operation of the apparatus 100. The controller 110 can operate audio output in a determined first mode of audio output operation that can power the first speaker 120 at a first bandwidth and at a first output level below a first output level threshold. The controller 110 can operate audio output in a determined second mode of audio output operation that can power the first speaker 120 at a high pass filtered second bandwidth 124 that filters out low frequencies of the first bandwidth. The second mode of audio output operation can also power the first speaker 120 at a second output level below a second output level threshold, where the second output level threshold is higher than the first output level threshold. The second mode of audio output operation can power the second speaker 130 at a low pass filtered second speaker bandwidth 134 that includes at least the low frequencies of the first bandwidth. The second mode of audio output operation can power the second speaker 130 at a low pass filtered second speaker bandwidth 134 that includes frequencies lower than the low frequencies of the first bandwidth.

Figure 2:
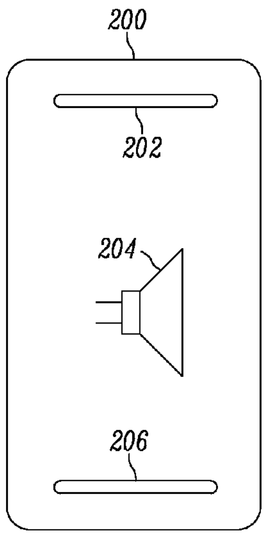
FIG. 2 is an example diagram of an apparatus according to a possible embodiment.

FIG. 2 is an example diagram of an apparatus 200, such as the apparatus 100, according to a possible embodiment. The apparatus 200 can include a first speaker 202, at least one second speaker 204, as well as other operational components. The apparatus can also include a third speaker 206 or more speakers. The speakers 202, 204, and/or 206 can include various speaker components, such as cones, coils, transducers, housing apertures, grills, and/or any other components useful for speakers. All of the speakers 202, 204, and 206 can be integral to the apparatus 200 in that they can be included as part of the apparatus 200, can be hard wired to the apparatus 200, can be included in the apparatus 200, and/or can be otherwise integral to the apparatus 200.

Figure 3:
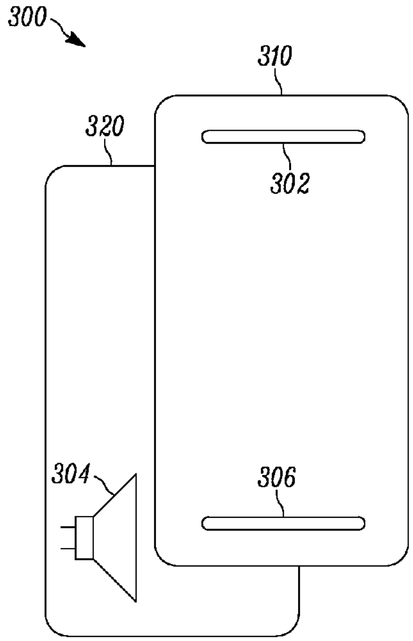
FIG. 3 is an example diagram of an apparatus according to a possible embodiment.

FIG. 3 is an example diagram of an apparatus 300, such as the apparatus 100, according to a possible embodiment. The apparatus 300 can include a first housing 310 and a second housing 320. The first housing 310 can include a first speaker 302. The second housing 320 can be a user detachable accessory speaker unit that can include at least one second speaker 304. The first housing 310 can also include at least one third speaker 306.

Figure 4:
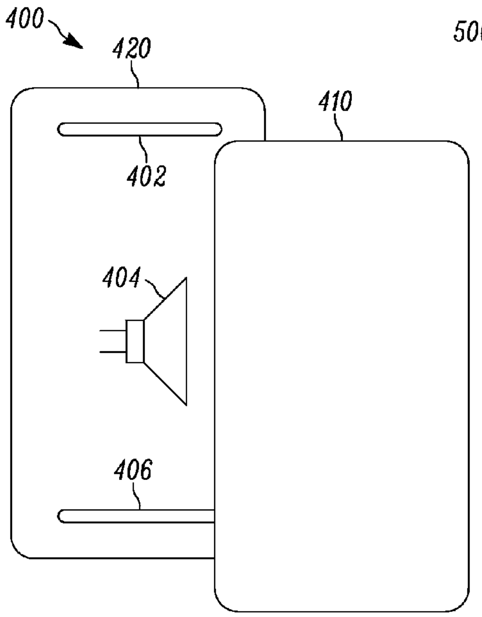
FIG. 4 is an example diagram of an apparatus according to a possible embodiment.

FIG. 4 is an example diagram of an apparatus 400, such as the apparatus 100 according to a possible embodiment. The apparatus 400 can include a first housing 410 and a second housing 420. The second housing 420 can be a user detachable accessory speaker unit that can include a first speaker 402, at least one second speaker 404, and at least one third speaker 406.

Figure 5:
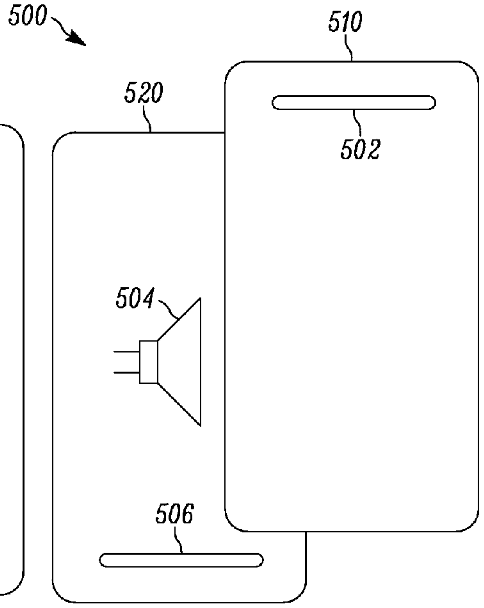
FIG. 5 is an example diagram of an apparatus according to a possible embodiment.

FIG. 5 is an example diagram of an apparatus 500, such as the apparatus 100, according to a possible embodiment. The apparatus 500 can include a first housing 510 and a second housing 520. The first housing 510 can include a first speaker 502. The second housing 520 can be a user detachable accessory speaker unit that can include at least one second speaker 504 and can also include at least one third speaker 506.

Referring back to FIG. 1, the apparatus 100 can be a mobile audio device that provides a wider frequency range, higher overall audio levels than a traditional device, while maintaining a reasonable package size with minimized cost. Such a mobile device can operate in two modes, a first mode where speakers in the mobile device operate at a normal level and bandwidth, and an enhanced mode that sends low frequency information to a second speaker, such as an accessory low frequency production unit that can also be referred to as a user detachable accessory speaker unit, and outputs the higher frequency audio from the mobile device speakers at a limited bandwidth with a higher output level than its previous full bandwidth level.

According to a possible embodiment, a mobile device can include a pair of integrated stereo speakers, such as speaker 302 and 306 of FIG. 3, driven by a smart audio amplifier and can include an easily removable low frequency sound reproduction unit. Stereo speakers in the mobile device can be attached to the smart audio amplifier, together or separately to two smart audio amplifiers, that controls the amplitude and bandwidth of the audio sent to the speakers as a function of a device mode.

In the first device mode, the easily removable low frequency sound reproduction unit may not be physically, electrically wirelessly, and/or otherwise attached to the mobile device. In this mode, the parameters used by the smart audio amplifier can produce a frequency bandwidth that is wider than the raw speaker response at a slightly increased level that is safe level for the speaker's bandwidth.

Figure 6:
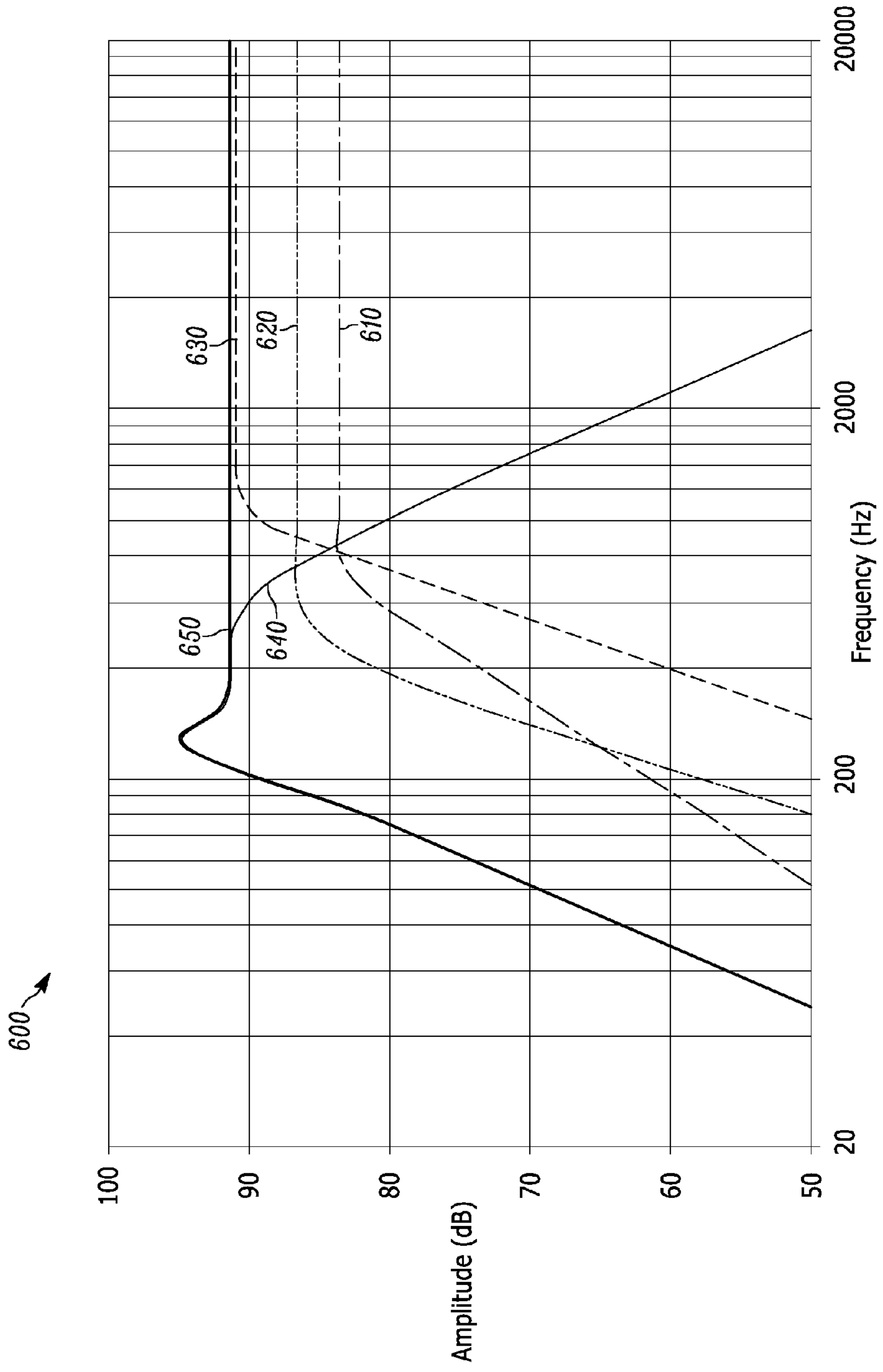
FIG. 6 is an example graph illustrating frequency vs. amplitude of audio signals according to a possible embodiment.

FIG. 6 is an example graph 600 illustrating frequency vs. amplitude of audio signals according to a possible embodiment. Curve 610 shows the acoustic output of raw speakers without modification by a smart amplification technology, and curve 620 shows the maximum acoustic output consistent with a first mode of operation, which shows the smart amplification technology allows for a wider bandwidth and higher output than the raw speakers in many cases. It should be noted that the acoustic output of raw speakers can be considered a first mode of operation and the acoustic output of smart amplifier driven speakers can be considered a second mode depending on the embodiment. The smart audio amplification technology can adapt gain in real time by looking at both excursion and thermal limitations of the speaker, as well as the combination of the two. The output in the lower reproduced frequencies can be limited primarily by excursion control, whereas the output in the upper frequencies of the reproduced frequency band can be primarily controlled by thermal limitations. When signals are present in both the excursion controlled and the thermal controlled frequency regions, the over-all level is reduced dynamically. If the content contains significant information simultaneously in both the high and low frequency ranges, the user may hear the audio level ramp down due to the smart amplifier's protection of the speaker.

In the second device mode, the easily removable low frequency sound reproduction unit can be attached to the mobile device. In this mode, the parameters used by the smart audio amplifier for the integrated speakers, such as speakers 302 and 306, produce a frequency range that is narrower than the raw speakers' response at a significantly increased level that is a safe level for that bandwidth.

The integrated speakers can essentially be high pass filtered at a point far enough above the integrated system's resonance where the excursion is not the primary limiting factor in the power limitations of the device. Different design criteria may be used for the high pass crossover frequency and filter slope. One option is to design a filter that is closely related to the excursion curve of the speakers, such as leveling out, or rolling off the excursion below the frequency at which the excursion profile becomes logarithmic, such as a linear curve on a log-log plot of amplitude vs frequency. This can allow an output significantly higher than the raw speakers that is not affected by the low frequency content, as it is only affected by the high frequency thermal content. Curve 630 shows the acoustic response of the integrated speakers for this embodiment.

The low frequency content can be electronically, mechanically, wirelessly, and/or otherwise directed to the larger detachable low frequency sound reproduction unit at a level that matches the acoustic output of the pair of integrated speakers. The content sent to the low frequency sound reproduction unit can be low pass filtered to remove the high frequency content that is being produced by the integrated speakers. The low frequency content is not attenuated by high frequency thermal content, but only by its excursion limitations. The amplifier driving this external speaker can be a normal audio amplifier or a smart audio amplifier with parameters set such that the excursion is controlled to operate the low frequency speaker(s) in a safe manner. Curve 640 shows the acoustic response of the low frequency sound reproduction unit for this embodiment. Curve 650 shows the combined acoustic response of the entire system in this embodiment. The low frequency sound reproduction unit can be any of an acoustic suspension system, such as a sealed system, a bass reflex system, such as a ported system, a bass reflex system using a passive radiator, a band pass system, a transmission line, and/or any other low frequency reproduction unit.

Figure 7:
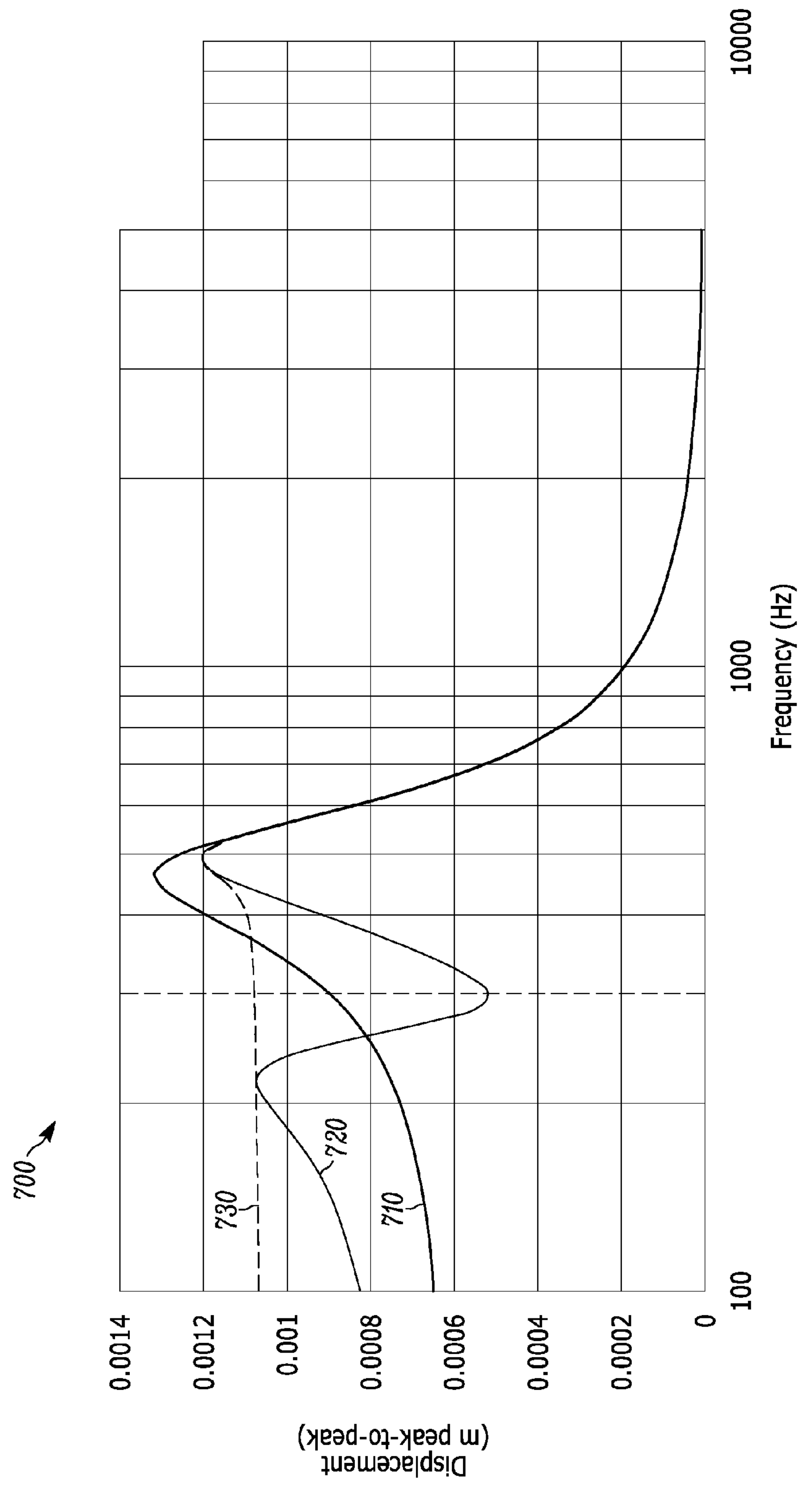
FIG. 7 shows excursion plots including an acoustic suspension plot and a bass reflex plot for corresponding systems according to a possible embodiment.

FIG. 7 shows excursion plots 700 including an acoustic suspension plot 710 and a bass reflex plot 720 for corresponding systems according to a possible embodiment. If the port of the bass reflex system is sufficiently damped, a sealed box model with leakage can be utilized as shown by the dashed line excursion curve 730. This can ensure that the excursion limits are not exceeded. However, at the points where the actual bass reflex plot curve 720 falls below the dashed line, the excursion can be limited before it is absolutely required. In the case of multiple low frequency speakers in a bass reflex topology, the speakers may be mounted in a single volume allowing for less volume taken up by redundant walls of the porting than that required for two separate volumes. If the port of the bass reflex system is not sufficiently damped the driver excursion at a frequency below the port/waveguide/passive radiator tuning frequency can exceed the level at the driver resonance. In this case, a second instance of a peak tracking algorithm can be implemented, and an adaptive frequency and Q dip filter can be applied to the incoming signal to ensure that no over excursion events occur.

Speaker excursion and thermal tracking in a smart drive amplifier can be done in each amplifier channel for the transducer that is driven by that channel. Embodiments can include a method of tying together 2, 3, 4, or more amplifiers such that a change in one amplifier for a channel can be communicated to the other amplifiers to elicit a compatible change in those channels as well. If for instance a right high frequency transducer is beginning to overheat, the right high frequency smart amplifier can reduce the gain to the right high frequency transducer to counter this. If that amplifier were to work purely independently, there would be a frequency dependent shift in the spatial placement of content. In order to prevent this, the gain of the right high frequency amplifier can be communicated to the other amplifiers, such as left high frequency, low frequency, and/or right and left low frequency amplifiers. These other amplifiers can then reduce their gain in unison with the right high frequency amplifier to keep the appropriate audio imaging and spectral balance.

Further logic can be used to determine if a particular amplifier adapts its gain to match another amplifier that has modified its own gain. In this embodiment, the high frequency channels can be controlled predominantly by thermal issues, whereas the low frequency channels can be predominantly controlled by excursion issues. If a high frequency channel gain is reduced in order to protect that speaker, all other amplifiers can adjust their gain as well to keep the imaging and spectral balance constant. On the other hand, if one of the low frequency channels goes into an excursion limiting mode and reduces its gain, the high frequency channels may not change gain, while other low frequency channels can change their gain to match the limiting low frequency channel. The result of this can be a constant audio image, but an excursion dependent low frequency response. This results in consistent sound pressure levels in the regions where intelligibility is determined, but a reduction in spectral balance in order to maintain intelligibility and apparent loudness. Excursion limiting can occur so quickly that the listener may not even notice a change in low frequency level. As the excursion limitation goes away, the spectral balance can return to normal as the low frequency amplifiers ramp back towards their default gain levels.

Likewise, the coupling between the gains of each amplifier can react to logic on a temporal basis as well. An excursion limitation can typically be a very short transient effect. If the limiting taking place on a single channel is short enough in nature, only that channel may react while leaving the other channels constant. If the limitation exceeds a certain threshold period of time, the other channels can adapt to keep that spatial and spectral balance constant. The gain for each channel can include fixed and adaptive gain components. The fixed gain components can be used to balance the spectral and spatial aspects of the system when no limiting is taking place. The adaptive gain component can be used in the real time speaker protection and in matching of other channels that are in a protection state.

In another embodiment, multiband/multichannel compressors can be used as opposed to smart audio amplifiers, with a similar communication and adaptation scheme. The integrated speakers can be high-pass filtered and then compressed, thereby increasing the overall level of the signal compared to the full bandwidth alternative. Likewise, the low frequency channel can be low pass filtered and compressed to a desired level. In order to maintain the spectral balance and imaging, compressor gains can be shared between the different channels, so that the compressors react with the same overall gain adjustments on each channel. Embodiments can also provide a system that uses smart amplification technology for at least one low frequency speaker while using compression for at least one high frequency speaker and vice versa.

In an alternative embodiment, a portable device can contain a pair of integrated high frequency stereo speakers, such as speakers 202 and 206, driven by two smart audio amplifiers and one or more low frequency speakers, such as speaker 204, driven by at least one other smart audio amplifier. The high frequency stereo speakers in the mobile device can be attached to a smart audio amplifier that controls the amplitude and bandwidth of the audio sent to these speakers. The low frequency speaker(s) in the mobile device can be attached to a smart audio amplifier that controls the amplitude and bandwidth of the audio sent to these low frequency speakers. The parameters used by the high frequency smart audio amplifier can produce a frequency range that is narrower than the raw speakers' response at a significantly increased level that is a safe level for that bandwidth. The high frequency speakers could essentially be high pass filtered at a point far enough above the system's resonance where the excursion is not the primary limiting factor in the power limitations of the device. This can allow an output significantly higher than that of the raw speakers that is not affected by the low frequency content, but primarily only by the high frequency, thermal limited content. These high frequency speakers can be mounted in a smaller acoustic volume than would normally be required, since they are not reproducing the low frequency content. Curve 630 of the graph 600 shows the acoustic response of the integrated speakers for this embodiment. The low frequency content can be directed to the larger low frequency sound reproduction unit at a level that matches the acoustic output of the pair of high frequency speakers. The content sent to the low frequency speakers can be low pass filtered to remove the high frequency content that is being produced by the high frequency speakers. The low frequency content may not be attenuated by high frequency thermal content, but primarily only by the low frequency excursion limitations. The amplifier driving the low frequency speaker(s) can be a normal audio amplifier or can be a smart audio amplifier with parameters set such that the excursion is controlled to operate the low frequency speaker(s) in a safe manner. Curve 640 of the graph 600 shows the acoustic response of the low frequency speakers for this embodiment. Curve 650 of the graph 600 shows the combined acoustic response of the entire system in this embodiment. The low frequency speakers can be any of an acoustic suspension system, such as a sealed system, a bass reflex system, such as a ported system, a bass reflex system using a passive radiator, a band pass system, a transmission line, and/or any other device that produces low frequency audio. Other embodiments can provide for speakers, such as speakers 402, 404, and 406, in a user detachable accessory speaker unit, such as unit 420, that operate on the principles illustrated in the embodiments discussed above. Similarly, other embodiments can provide for at least an integrated first high frequency speaker, such as speaker 502, and at least a second high frequency speaker and at least one low frequency speaker, such as speakers 504 and 506, respectively, in a user detachable accessory speaker unit 520 that operate on the principles illustrated in the embodiments discussed above.

Embodiments can provide a system where each of the banded speakers is actively driven to its maximum performance limits, without the limitations imposed on full-frequency smart-driven systems. Further, a user-convertible option can allow the user to switch between a full-frequency smart-driven system and a smart-driven system with banded speakers, where each system can be actively driven to its maximum performance limits. This can allow for the production of unprecedented audio levels and bandwidth for a portable communication system, and also can produce audio in a more battery life conserving mode.

Figure 8:
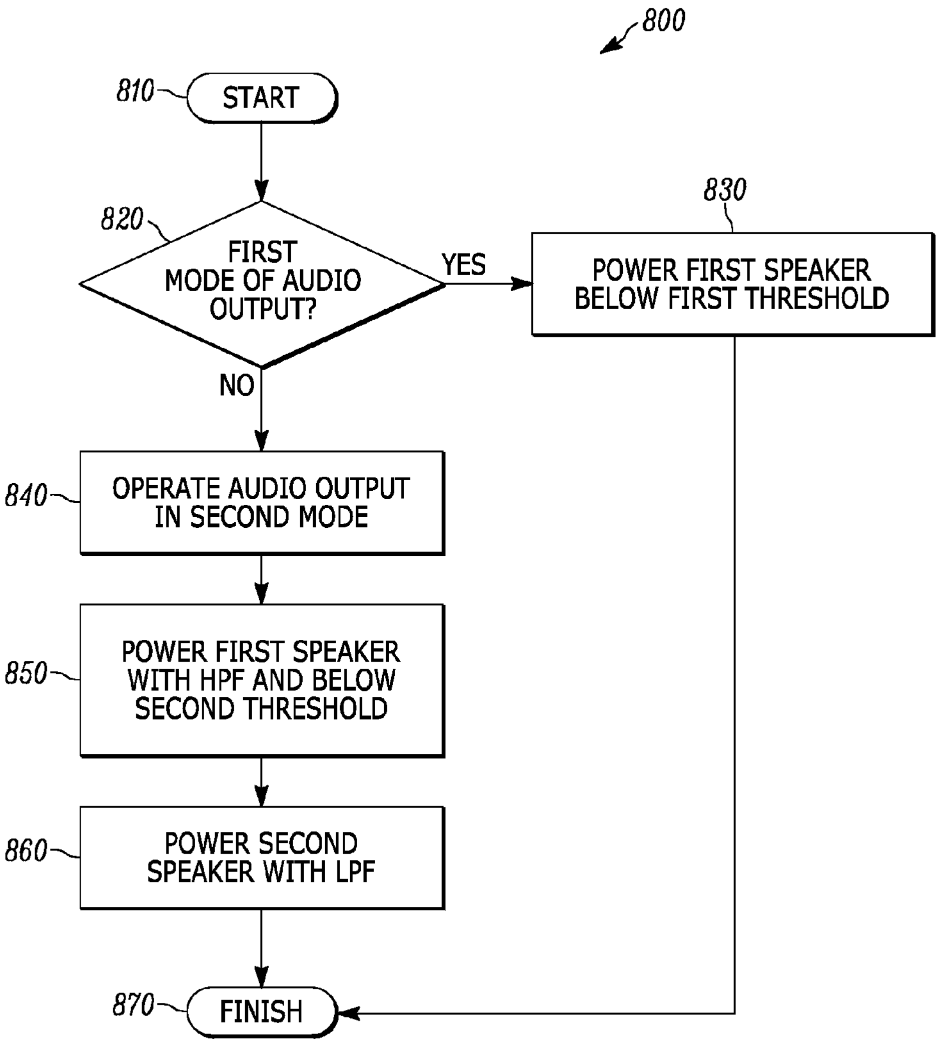
FIG. 8 is an example flowchart illustrating the operation of a device according to a possible embodiment.

FIG. 8 is an example flowchart 800 illustrating the operation of a device, such as the apparatus 100, according to a possible embodiment. The device can be a user portable electronic device that is easily portable by a user and can include a battery for operation when detached from an external power supply. The device can also be an accessory device that attaches to a user portable electronic device or a combination of a user portable electronic device and an accessory device. The first speaker can be an integrated device speaker in that it is part of the apparatus or can be part of the accessory device. At 810, the flowchart 800 can begin.

At 820, a mode of audio output operation of the device can be determined. Determining can be performed by detecting the presence of the second speaker and determining the mode of audio output operation is the second mode of audio output operation when the second speaker is present. The determination can also be based on a user setting, based on the type of audio being reproduced, based on the remaining battery life, based on sonic characteristics of the audio being reproduced, based on environmental conditions, and/or based on any other factors useful for determining a mode of audio output operation. If the mode is a first mode of audio output operation, at 830, an audio output of the device can be operated in the determined first mode, where the first mode of audio output operation can power at least one first speaker at a first bandwidth and at a first output level below a first output level threshold.

If the mode is not the first mode, at 840 the audio output of the device can be operated in a second mode. At 850, the second mode of audio output operation can power the at least one first speaker at a high pass filtered second bandwidth that filters out low frequencies of the first bandwidth. The second mode of audio output operation can also power the at least one first speaker at a second output level below a second output level threshold, where the second output level threshold is higher than the first output level threshold, and where the second output level exceeds the first output level threshold at least once. For example, the second mode allows the device to play audio louder than the first mode because it uses two speakers to avoid the combination of thermal and excursion limitations on a single speaker.

At 860, the second mode of audio output operation can additionally power at least one second speaker at a low pass filtered third speaker bandwidth that includes at least the low frequencies of the first bandwidth. The low pass filtered third speaker bandwidth can include lower frequencies than the first bandwidth. For example, the second speaker can produce lower frequency audio signals than the at least one first speaker. The second speaker can alternately have the same frequency response as the first speaker with different frequencies being directed to each of the speakers to avoid thermal and excursion limitations of a single speaker and improve audio output performance of the device. According to a possible implementation, the second speaker can be a bass reflex speaker including a port that is damped such that excursion at and below port resonance does not exceed speaker excursion at speaker resonance.

The at least one first speaker can be powered by a smart audio amplifier that controls the amplitude and bandwidth of audio sent to the first speaker as a function of the mode of audio output operation. The smart audio amplifier can adapt output power to at least one first speaker based on an estimation of excursion and an estimation of real time thermal conditions of the at least one first speaker. The estimation can be an ongoing estimation.

The first speaker can be an integrated device speaker and the second speaker can be an auxiliary speaker that is part of a user detachable accessory speaker unit 520 that is external to the device and is attachable to the device by the user and detachable from the device by the user. The integrated speaker can be more than one speaker, such as stereo or surround speakers. The auxiliary speaker can also be an integrated speaker that is part of the device. The first speaker can alternately be part of a user detachable accessory speaker unit. The auxiliary speaker can be more than one speaker.

According to a possible embodiment, the first speaker can be an integrated first high frequency speaker that produces higher frequencies than the second speaker and the second speaker can be at least one low frequency second speaker that produces lower frequencies than the high frequency speaker. The user detachable accessory speaker unit can also include a third speaker configured as a second high frequency speaker with similar frequency characteristics to the first high frequency speaker. For example, the first high frequency speaker can provide a first audio channel and the accessory speaker unit can provide a second audio channel using the second high frequency speaker to create a stereo pair of speakers along with the low frequency second speaker. Audio to the second high frequency speaker can be processed similarly to the audio to the integrated device speaker.

According to a possible implementation, the at least one first speaker can be stereo speakers, where a first stereo speaker of the stereo speakers can be powered by a first smart audio amplifier and a second stereo speaker of the stereo speakers is powered by a second smart audio amplifier. The first stereo speaker can be a stereo speaker in that it is part of a stereo pair of speakers and outputs a first channel of two channels for stereo and the second stereo speaker outputs a second channel of the two channels. A change in output of the first smart audio amplifier based on speaker conditions of the first stereo speaker can influence a change in output of the second smart audio amplifier to the second stereo speaker.

According to another possible implementation, the low pass filtered second speaker bandwidth can limit content to a level that is primarily excursion limited for the second speaker and the high pass filtered second bandwidth limits content to a level that is primarily thermal limited for the integrated speaker For example, the low pass filtered second speaker bandwidth can limit content to that which is primarily excursion limited by characteristics of the second speaker and the high pass filtered second speaker bandwidth can limit content to that which is primarily thermal limited by characteristics of the integrated speaker. The at least one smart audio amplifier can adapt output power to at least one speaker by limiting output in lower frequencies based on excursion control, and by limiting output in the higher frequencies based on thermal conditions of the at least one speaker. Furthermore, high pass filtering can completely high pass filter content to substantially limit low frequency content. Alternately, high pass filtering can mildly high pass filter content so there is still some attenuated low frequency content passed, which can result in mild excursion limiting, and where the main cause of limiting can still primarily be thermal limiting.

According to another possible implementation, the at least one first speaker can be powered by a first audio amplifier and the second speaker can be powered by a second audio amplifier. A change in output of one of the first audio amplifier and the second amplifier based on speaker conditions of the corresponding speaker can influence a change in output of the other of the first audio amplifier and the second audio amplifier to the other corresponding speaker. Alternately, a change in output of the first audio amplifier can be independent of a change in output of the second audio amplifier. Also, change in output of at least one audio amplifier powering at least one speaker can be independent of a change in output of at least one other audio amplifier powering at least one other speaker until a threshold time period is reached, and after the threshold time period is reached, the at least one other audio output amplifier output can be changed to correspond to the change in output of the at least one audio output amplifier. At 870, the flowchart 800 can end.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. The device may also have other modes of audio output operation that can employ disclosed embodiments. For example, while only two modes are shown in the flowchart, the device can also have additional modes that can be determined in additional steps. Also, some of the steps performed can be repeated on an ongoing or continuous basis simultaneously while other steps are performed. Furthermore, different steps can be performed by different elements or in a single element of the disclosed embodiments.

Figure 9:
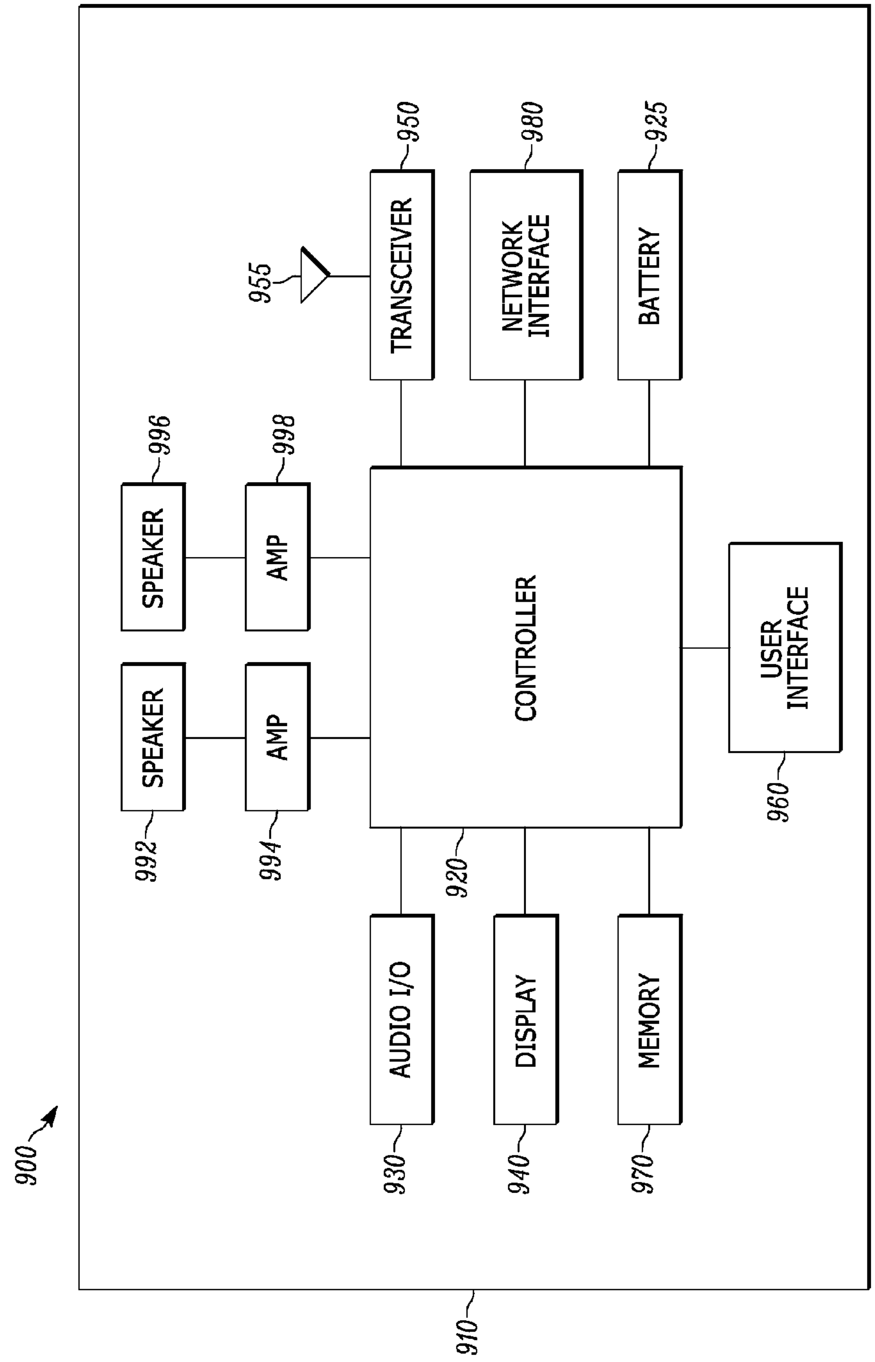
FIG. 9 is an example block diagram of an apparatus according to a possible embodiment.

FIG. 9 is an example block diagram of an apparatus 900, such as the apparatus 100, according to a possible embodiment. The apparatus 900 can perform the methods described in all the embodiments. The apparatus 900 can be a user portable electronic device that is easily portable by a user and can include a battery 925 for operation when detached from an external power supply. The apparatus 900 can also be a device that may not have a battery and can be powered by an external power supply. The apparatus 900 can further be an accessory device that attaches to a user portable electronic device or other device, where all of the elements shown may not be necessary. The apparatus 900 can include a housing 910, a controller 920 within the housing 910, audio input and output circuitry 930 coupled to the controller 920, a display 940 coupled to the controller 920, a transceiver 950 coupled to the controller 920, an antenna 955 coupled to the transceiver 950, a user interface 960 coupled to the controller 920, a memory 970 coupled to the controller 920, and a network interface 980 coupled to the controller 920. The apparatus 900 can also include a first speaker 992 and corresponding amplifier 994 and a second speaker 996 and corresponding amplifier 998. The first speaker 992 can be an integrated device speaker in that it is part of the apparatus 900 or it can be separate from and coupled to the apparatus 900. The second speaker can be an enclosed speaker or any other speaker. For example, the second speaker 996 can be a bass reflex speaker including a port that is damped such that excursion at and below port resonance does not exceed speaker excursion at speaker resonance, or it can be a more typical ported speaker with less damping. The second speaker 996 can be part of a user detachable accessory speaker unit that is external to the apparatus 900, is attachable to the apparatus 900 by the user, and is detachable from the apparatus 900 by the user. The second speaker 996 can also be an integrated speaker that is part of the apparatus 900. The first speaker 992 can be a first high frequency speaker that produces higher frequencies than the second speaker 996 and the second speaker 996 can be at least one low frequency second speaker that produces lower frequencies than the high frequency speaker or vice versa. A user detachable accessory speaker unit can include a second high frequency speaker with similar frequency characteristics to the first high frequency speaker. For example, the first high frequency speaker can provide a first audio channel and the accessory speaker unit can provide a second audio channel using the second high frequency speaker to create a stereo pair of speakers along with the low frequency second speaker. Audio to a second high frequency speaker can be processed similarly to the audio to the first speaker 992.

The first amplifier 994 can be a smart audio amplifier that can power the at least one first speaker 992 and can control the amplitude and bandwidth of audio sent to the first speaker as a function of the mode of audio output operation. For example, a smart audio amplifier can adapt output power to at least one first speaker 992 based on an estimation of excursion and an estimation of real time thermal conditions of the at least one first speaker 992. The estimation can be an ongoing estimation. The first amplifier 994 can also be normal amplifier. The second amplifier 998 can similarly be a smart audio amplifier or other amplifier.

The display 940 can be a viewfinder, a liquid crystal display (LCD), a light emitting diode (LED) display, a plasma display, a projection display, a touch screen, or any other device that displays information. The transceiver 950 can include a transmitter and/or a receiver. The audio input and output circuitry 930 can include a microphone, a speaker, a transducer, or any other audio input and output circuitry. The user interface 960 can include a keypad, a keyboard, buttons, a touch pad, a joystick, a touch screen display, another additional display, or any other device useful for providing an interface between a user and an electronic device. The network interface 980 can be a Universal Serial Bus (USB) port, an Ethernet port, an infrared transmitter/receiver, an IEEE 1399 port, a WLAN transceiver, or any other interface that can connect an apparatus to a network or computer and that can transmit and receive data communication signals. The memory 970 can include a random access memory, a read only memory, an optical memory, a flash memory, a removable memory, a hard drive, a cache, or any other memory that can be coupled to a wireless communication device.

The apparatus 900 or the controller 920 may implement any operating system, such as Microsoft Windows®, UNIX®, or LINUX®, Android™, or any other operating system. Apparatus operation software may be written in any programming language, such as C, C++, Java or Visual Basic, for example. Apparatus software may also run on an application framework, such as, for example, a Java® framework, a .NET® framework, or any other application framework. The software and/or the operating system may be stored in the memory 970 or elsewhere on the apparatus 900. The apparatus 900 or the controller 920 may also use hardware to implement disclosed operations. For example, the controller 920 may be any programmable processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the controller 920 may be any controller or processor device or devices capable of operating an electronic device and implementing the disclosed embodiments.

In operation, the controller 920 can control operations of the apparatus 900. The controller 920 can determine a mode of audio output operation of the apparatus 900. According to a possible implementation, the controller 920 can detect the presence of the second speaker 996 and determine the mode of audio output operation is the second mode of audio output operation when the second speaker 996 is present. The controller 920 can also determine the mode of audio output operation through other methods disclosed in other embodiments. The controller 920 can operate audio output in a determined first mode of audio output operation, where the first mode of audio output operation powers the at least one first speaker 992 at a first bandwidth and at a first output level below a first output level threshold. The controller 920 can operate audio output in a determined second mode of audio output operation, where the second mode of audio output operation can power the at least one first speaker 992 at a high pass filtered second bandwidth that filters out low frequencies of the first bandwidth. The second mode of audio output operation can also power the at least one first speaker 992 at a second output level below a second output level threshold, where the second output level threshold is higher than the first output level threshold, and where the second output level exceeds the first output level threshold at least once. The second mode of audio output operation can also power the at least one second speaker 996 at a low pass filtered second speaker bandwidth that includes at least the low frequencies of the first bandwidth. The low pass filtered second speaker bandwidth can include lower frequencies than the first bandwidth.

The method of this disclosure can be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as “first,” “second,” and the like may be used solely to distinguish one entity or action from another entity or action without necessarily requiring or implying any actual such relationship or order between such entities or actions. The phrase “at least one of” followed by a list is defined to mean one, some, or all, but not necessarily all of, the elements in the list. The terms “comprises,” “comprising,” or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by “a,” “an,” or the like does not, without more constraints, preclude the existence of additional identical elements in the process, method, article, or apparatus that comprises the element. Also, the term “another” is defined as at least a second or more. The terms “including,” “having,” and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

We claim:

1. A method comprising:

determining a mode of audio output operation of a device;

operating audio output in a determined first mode of audio output operation, where the first mode of audio output operation powers at least one first speaker at a first bandwidth and at a first output level below a first output level threshold; and operating audio output in a determined second mode of audio output operation, where the second mode of audio output operation powers the at least one first speaker at a high pass filtered second bandwidth that filters out low frequencies of the first bandwidth, where the second mode of audio output operation powers the at least one first speaker at a second output level below a second output level threshold, where the second output level threshold is higher than the first output level threshold, and where the second output level exceeds the first output level threshold at least once, and where the second mode of audio output operation powers at least one second speaker at a low pass filtered second speaker bandwidth that includes at least the low frequencies of the first bandwidth.

2. The method according to claim 1, wherein the first speaker comprises an integrated device speaker, and wherein the second speaker comprises an auxiliary speaker that is part of a user detachable accessory speaker unit that is external to the device and is attachable to the device by the user and detachable from the device by the user.

3. The method according to claim 2, wherein the integrated device speaker comprises a first high frequency speaker that produces higher frequencies than the second speaker, wherein the second speaker comprises at least one low frequency second speaker that produces lower frequencies than the high frequency speaker, and wherein the user detachable accessory speaker unit includes a second high frequency speaker with similar frequency characteristics to the first high frequency speaker.

4. The method according to claim 2, further comprising detecting the presence of the second speaker, wherein determining comprises determining the mode of audio output operation is the second mode of audio output operation when the second speaker is present.

5. The method according to claim 1, wherein the second speaker produces lower frequency audio signals than the at least one first speaker.

6. The method according to claim 1, wherein the second speaker is a bass reflex speaker including a port that is damped such that speaker excursion at and below port resonance does not exceed speaker excursion at speaker resonance.

7. The method according to claim 1, wherein the at least one first speaker is powered by a smart audio amplifier that controls the amplitude and bandwidth of audio sent to the first speaker as a function of the mode of audio output operation.

8. The method according to claim 7, wherein the smart audio amplifier adapts output power to at least one first speaker based on an estimation of excursion and an estimation of real time thermal conditions of the at least one first speaker.

9. The method according to claim 7, wherein the at least one first speaker comprises stereo speakers, wherein a first stereo speaker of the stereo speakers is powered by a first smart audio amplifier, wherein a second stereo speaker of the stereo speakers is powered by a second smart audio amplifier, and wherein a change in output of the first smart audio amplifier based on speaker conditions of the first stereo speaker influences a change in output of the second smart audio amplifier to the second stereo speaker.

10. The method according to claim 1, wherein the low pass filtered second speaker bandwidth limits content to a level that is primarily excursion limited for the second speaker and the high pass filtered second bandwidth limits content to a level that is primarily thermal limited for the first speaker.

11. The method according to claim 1, wherein the at least one first speaker is powered by a first audio amplifier, wherein the second speaker is powered by a second audio amplifier, and wherein a change in output of one of the first audio amplifier and the second amplifier based on speaker conditions of the corresponding speaker influences a change in output of the other of the first audio amplifier and the second audio amplifier to the other corresponding speaker.

12. The method according to claim 1, wherein the at least one first speaker is powered by a first audio amplifier, wherein the second speaker is powered by a second audio amplifier, and wherein a change in output of the first audio amplifier is independent of a change in output of the second audio amplifier.

13. The method according to claim 1, wherein a change in output of at least one audio amplifier powering at least one speaker is independent of a change in output of at least one other audio amplifier powering at least one other speaker until a threshold time period is reached, and after the threshold time period is reached, the at least one other audio output amplifier output is changed to correspond to the change in output of the at least one audio output amplifier.

14. An apparatus comprising:

a controller configured to control operations of the apparatus;

at least one first speaker coupled to the controller; and a second speaker coupled to the controller, wherein the controller is configured to determine a mode of audio output operation of the apparatus, operate audio output in a determined first mode of audio output operation, where the first mode of audio output operation powers the at least one first speaker at a first bandwidth and at a first output level below a first output level threshold, and operate audio output in a determined second mode of audio output operation, where the second mode of audio output operation powers the at least one first speaker at a high pass filtered second bandwidth that filters out low frequencies of the first bandwidth, where the second mode of audio output operation powers the at least one first speaker at a second output level below a second output level threshold, where the second output level threshold is higher than the first output level threshold, and where the second output level exceeds the first output level threshold at least once, and where the second mode of audio output operation powers the at least one second speaker at a low pass filtered second speaker bandwidth that includes at least the low frequencies of the first bandwidth.

15. The apparatus according to claim 14, wherein the second speaker is part of a user detachable accessory speaker unit that is external to the apparatus, is attachable to the apparatus by the user, and is detachable from the apparatus by the user.

16. The apparatus according to claim 15, wherein the controller is configured to detect the presence of the second speaker, wherein determining comprises determining the mode of audio output operation is the second mode of audio output operation when the second speaker is present.

17. The apparatus according to claim 14, wherein the second speaker produces lower frequency audio signals than the at least one first speaker.

18. The apparatus according to claim 14, wherein the second speaker is a bass reflex speaker including a port that is damped such that speaker excursion at and below port resonance does not exceed speaker excursion at speaker resonance.

19. The apparatus according to claim 14, wherein the at least one first speaker is powered by a smart audio amplifier that controls the amplitude and bandwidth of audio sent to the first speaker as a function of the mode of audio output operation.

20. A method comprising:

determining a mode of audio output operation of a device;

operating audio output in a determined first mode of audio output operation, where the first mode of audio output operation powers at least one integrated device speaker at a first bandwidth and at a first output level below a first output level threshold; and operating audio output in a determined second mode of audio output operation, where the second mode of audio output operation powers the at least one integrated device speaker at a high pass filtered second bandwidth that filters out low frequencies of the first bandwidth, where the second mode of audio output operation powers the at least one integrated device speaker at a second output level below a second output level threshold, where the second output level threshold is higher than the first output level threshold, and where the second output level exceeds the first output level threshold at least once, and where the second mode of audio output operation powers at least one auxiliary speaker at a low pass filtered auxiliary speaker bandwidth that includes at least the low frequencies of the first bandwidth, where the auxiliary speaker produces lower frequency audio signals than the at least one integrated device speaker, wherein the at least one integrated device speaker is powered by a smart audio amplifier that controls the amplitude and bandwidth of audio sent to the integrated device speaker as a function of the mode of audio output operation, where the smart audio amplifier adapts output power to at least one integrated device speaker based on an estimation of excursion and an estimation of real time thermal conditions of the at least one integrated device speaker.

* * * * *